United States Patent
Naumann

(10) Patent No.: US 10,917,079 B2
(45) Date of Patent: *Feb. 9, 2021

(54) VARIABLE STREAM PULSE WIDTH MODULATION

(71) Applicant: TEXAS INSTRUMENTS INCORPORATED, Dallas, TX (US)

(72) Inventor: Albrecht Lutz Naumann, Geldern (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/591,009

(22) Filed: Oct. 2, 2019

(65) Prior Publication Data

US 2020/0044641 A1 Feb. 6, 2020

Related U.S. Application Data

(63) Continuation of application No. 16/057,420, filed on Aug. 7, 2018, now Pat. No. 10,483,959.

(60) Provisional application No. 62/541,799, filed on Aug. 7, 2017, provisional application No. 62/611,882, filed on Dec. 29, 2017.

(51) Int. Cl.
*H03K 7/00* (2006.01)
*H03K 7/08* (2006.01)

(52) U.S. Cl.
CPC ............... *H03K 7/08* (2013.01); *H03K 7/00* (2013.01)

(58) Field of Classification Search
CPC ................... H03K 7/08; H03K 7/00
See application file for complete search history.

(56) References Cited

U.S. PATENT DOCUMENTS

| | | | |
|---|---|---|---|
| 7,750,751 B2* | 7/2010 | Bertrand | H03K 7/04 332/104 |
| 9,281,811 B2 | 3/2016 | Bruennert et al. | |
| 10,483,959 B2* | 11/2019 | Naumann | H03K 7/08 |
| 2003/0194240 A1 | 10/2003 | Mollenauer et al. | |
| 2010/0098436 A1 | 4/2010 | Mahgerefteh et al. | |

* cited by examiner

*Primary Examiner* — Dinh T Le
(74) *Attorney, Agent, or Firm* — Brian D. Graham; Charles A. Brill; Frank D. Cimino

(57) ABSTRACT

An example device includes splitter logic to split an input sample having a predetermined number of bits into a first segment of most significant bits and a second segment of least significant bits. Pulse logic generates a pattern of pulses that correlate to the values of the most significant bits. Edge mover logic determines edge adjustment data based on the values of the least significant bits, the edge adjustment data representing an adjustment to at least one edge in the pattern of pulses. Combiner logic generates an enhanced pulse stream by adjusting at least one edge in the pattern of pulses based on the edge adjustment data.

20 Claims, 6 Drawing Sheets

VARIABLE STREAM PULSE WIDTH MODULATION

CROSS-REFERENCE TO RELATED APPLICATIONS

This application is a continuation of U.S. patent application Ser. No. 16/057,420, filed Aug. 7, 2018, which claims priority to U.S. provisional application No. 62/541,799, filed Aug. 7, 2017, and claims priority to U.S. provisional application No. 62/611,882, filed Dec. 29, 2017, each of which is hereby fully incorporated in by reference.

TECHNICAL FIELD

This disclosure relates generally to variable stream pulse width modulation.

SUMMARY

One example relates to a modulator the modulator includes splitter logic that receives and partition on input sample data into at least a first to a second data field and data field, wherein the first pulse data field includes a structure value and the second data field includes a pulse placement value. Pattern logic determines a sequence of one or more pulse based on the structure of the value of the first data field. Edge pulse mover logic determines edge adjustment data based on the value of the second data field placement, the edge adjustment data to specify where at least one edge of the sequence of one or more pulse is to be moved. Combiner logic combines the sequence of the one or more pulse and the edge adjustment data to provide enhanced output pulse stream that includes at least one edge thereof at based on the edge adjustment a location data.

Another example relates to a device. The device includes logic splitter to split on input sample having a predetermined number of bits into a first segment of most significant bits and a second segment of least significant bits. Pulse logic generates a pattern of pulses that correlate to the values of the most significant bits. Edge mover logic determines edge adjustment data based on the values of the least significant bits, the edge adjustment data representing an adjustment to at least one edge in the pattern of pulses. Combiner logic generates an enhanced pulse stream by adjusting at least one edge in the pattern of pulses based on the edge adjustment data.

Yet another example relates to a method. The method includes sampling a stream of input digital data to provide to input sample. The method also includes splitting the input sample into a segment of most significant bits and a segment of least significant bits. The method also includes generating a sequence of pulses based on the segment of most significant bits. The method also includes determining a location for moving at least one edge in the sequence of pulses based on the segment of least significant bits. The method also includes generating an output stream of enhanced data pulses by adjusting the at least one edge of the sequence of data pulses based on the determined location.

DETAILED DESCRIPTION

This disclosure relates to devices, systems, and methods to provide variable stream PWMs (VSPWMs). One example device may include splitter logic, pattern logic, and edge mover logic. In one example, the splitter logic splits segments of an input sample (e.g., a frame) of a stream digital input data into two or more fields. The pulse logic generates a sequence of pulses based on at least one of the two or more fields. For example, the pulse logic generates a sequence of pulses based on a field of most significant bits (MSBs). The edge mover logic determines edge placement data for moving one or more edges of the sequence of pulses based on at least one of the other two or more fields. For example, the edge mover logic determines edge placement locations for one or more pulses in the sequence of pulses based on the field of least significant bits (LSBs). The MSBs and LSBs may be non-overlapping continuous set of bits in the input data frame. The combiner combines the sequence of digital pulses and moves edges according to an edge mover logic instruction data to create enhanced digital data. In some examples, the combiner logic produces an analog output signal based on the enhanced digital data.

As used herein, a "segment" of a stream of digital data is a continuous sequence of original bits from the input sample (e.g., a frame) that has not been reordered. Whether the segment is in the form of byte(s), two-or-more bits, or other sized portions, none of the bits in any segment are reordered from the original input ordering.

By way of further example, VSPWMs use an amplitude-dependent pattern stream for a part of the resolution of pulses used for conversion (e.g., represented by the most significant bits (MSBs) of a frame) and varying one or more edges of a pulse represented by a remaining resolution by the frame's least significant bits (LSBs). This may decrease the ripple near zero crossings of the filtered output because, at lower frequency spectrum frequencies, the low frequency amplitudes are reduced by pulse reshaping and movement so that a desired benefit of noise shaping is introduced. This also enables simpler subsequent filtering of the output VSPWM pulse stream to be implemented compared to existing PWM approaches. Additionally, the timing resolution of the original PWM is maintained so that there is no need to increase the clock frequency.

As an example, when designing the circuitry and methods to generate VSPWMs, certain tradeoffs may exist between signal characteristics of resolution of pulse timing, frame rate, and switch frequency, which may increase one or more of the characteristics over others. These tradeoffs may eventually allow for further improving the ripple/signal ratio for small signals as well as improve the frequency spectrum by attenuating the fundamental frequency(s) and shifting the switching noise to higher frequencies having small amplitudes (noise shaping).

Figure 1:
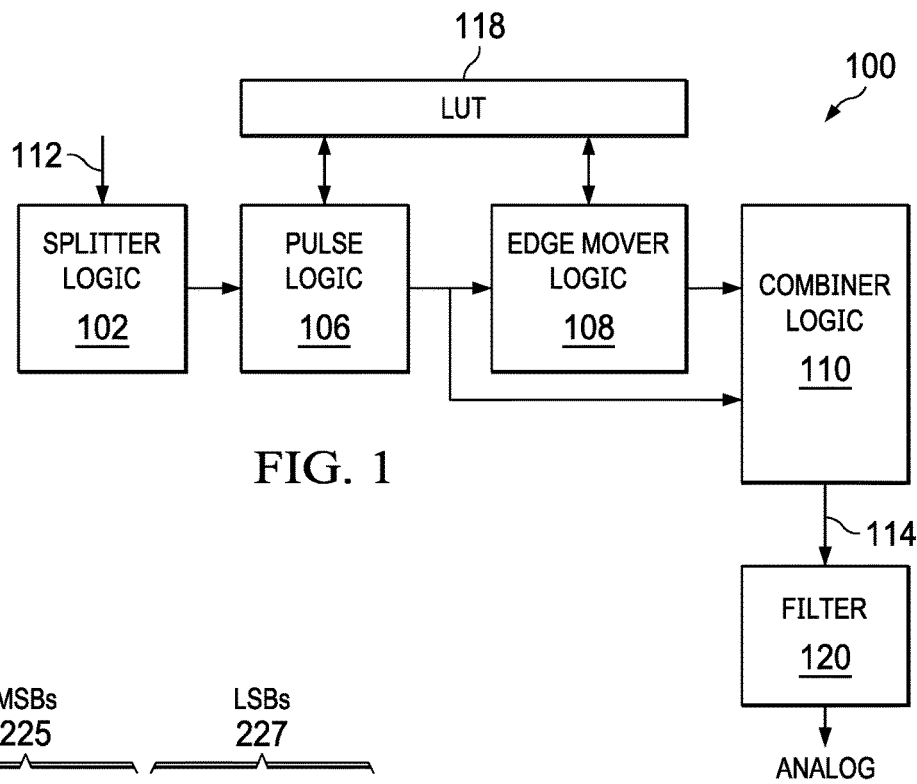
FIG. 1 is a block diagram illustrating on example device to implement variable stream pulse width modulation.

FIG. 1 illustrates one example of a device 100 (e.g., a modulator). As disclosed herein, the device 100 can generate enhanced digital data (e.g., a stream of digital data) that can be converted into an analog representation of the digital data. The example device 100 includes splitter logic 102, pulse logic 106, edge mover logic 108, and combiner logic 110, which in some examples may be fabricated on a common substrate (e.g., integrated in a common chip or die). For example, the device 100 and its logic blocks may be implemented as hardware on a silicon chip, in an integrated circuit, in hardware descriptive language (HDL), in a field-programmable gate-array (FPGA), with discrete logic devices. In other examples, the logic may be implemented in an arithmetic logic unit (ALU), which may be a standalone ALU or within a processor core. Thus, the functionality implemented by the logic in the device 100 may be implemented in a variety of ways.

The splitter logic 102 splits frames of digital input data 112 (e.g., a multi-bit word) into two or more fields, such as the MSBs and LSBs. The MSBs and LSBs may be non-overlapping continuous set of bits in each input data frame. The MSBs, which may be referred to as a pulse-shape field, may specify part of a pulse's shape. The LSBs, which may be referred to as an edge-placement field, specify which edge (or edges) is to be moved and/or how each such edge(s) is moved with respect to time. As an example, the splitter logic includes a counter or other function to divide the input sample into the respective fields. As another example, the splitter logic 102 may be implemented, for example, as a de-multiplexer (e.g., a 1-to-2 multiplexer) to perform part of the splitting of MSBs and LSBs from the sample for each frame. The bit values of the MSBs and LSBs may be stored in registers, latches, flip-flops, and the like for subsequent processing (e.g., by pulse logic 106 and edge mover logic 108).

In some examples, the splitter logic 102 divides an input sample (a data frame) into respective pairs of data fields. For example, each data pair may include a pulse structure field (e.g., MSBs) and an edge placement field (LSBs). Thus, data pairs may correspond to digital values of continuous input sample segments extracted from each frame of a given digital input stream, such that each data pair is correlated to a single input sample segment.

The pulse logic 106 accesses data fields provided by the splitter logic 102 to generate a sequence of pulses (e.g., ΔΣ sequences) based on the values in the field. For example, each respective pulse in the sequence has a value correlated to a value in the field and has a predetermined width (e.g., a fixed predetermined width). For instance, the pulse logic 106 utilizes the bit-values in the pulse-shape field to create the sequence of data pulses having corresponding spread energy for a respective input data frame. In this way, the pulse shape field may contain information useful to plan numbers of pulses, pulse length, and/or other information to facilitate creating spread energy signals. The pulse logic 106 may provide the sequence of pulses as a stream and/or store the sequence as pulse data (e.g., in registers, latches, flip-flops, and the like) for subsequent access and processing.

In some examples, the pulse logic 106 utilizes a look-up table (LUT) 118 to determine the sequence of pulses. For example, the LUT 118 is preprogrammed with a plurality of different patterns of pulses, each including a number and placement of pulses that correlate to values of the most significant bits. The LUT 118 may be part of the pulse logic 106 or separate memory device configured as the LUT. Either way, the MSBs can be used to index the LUT 118 and return a corresponding sequence of pulses. In an example, the sequence of pulses can be generated directly by the LUT. In another example, a pulse stream generator (e.g., part of the pulse logic or separate circuitry—not shown) can receive the pulse data from the LUT and generate the selected sequence of pulses in response to the pulse data. As mentioned, in other examples, the pulse logic 106 is implemented (e.g., as an ALU or processor) to compute, in real time, the sequence of pulses.

The edge mover logic 108 determines edge placement data based on the edge-placement field of the input sample segment. For example, the edge mover logic 108 is adapted to determine where to move one or more edges of one or more pulses in the sequence generated by the pulse logic of a stream of pulses based on the edge-placement field. The edge-placement field may contain information useful to plan where one or more pulse edges of the sequence of pulses should be moved to reduce noise and spread energy for a given input frame. The edge mover logic 108 may store edge placement data in memory (e.g., in registers, latches, flip-flops, and the like) for subsequent processing by the combiner logic 110.

In some examples, the edge mover logic 108 utilizes a look-up table (LUT) 118 to determine the edge placement data. The LUT 118 thus may include one or more LUTs, each programmed to provide corresponding data to enable generating enhanced data pulses as disclosed herein. For example, the edge mover logic 108 uses the edge-placement field from the input sample (e.g., the MSBs and/or LSBs) as an index that is applied to the LUT 118. The LUT 118 returns edge placement data specifying to where move one or more edges of the sequence of pulses. The LUT 118 may return the information to the logic 108 or directly to the combiner logic 110. While, in the example, of FIG. 1, the LUT 118 is demonstrated as being separate from edge mover logic 108, in other examples, the LUT may be implemented (e.g., integrated) in the edge mover logic. As another example, the edge mover logic 108 is implemented (e.g., as an ALU or processor) to compute in real time where to move one or more edges in the sequence of pulses (provided by pulse logic 106). The real time computations and resulting edge adjustments may be based on pulse logic data, the MSBs or based on the entire input sample.

In some examples, the number of pulses (e.g., the duration) of the sequence of pulses is predetermined for a given input sample, and the LUT 118 can be preprogrammed to determine edge placement data according to the digital value of the LSBs. In other examples, the LUT can be programmed to accommodate different size input samples to provide corresponding edge placement data depending on the shape of the PWM of a corresponding digital input data 112, as represented by the MSBs and/or LSBs thereof. This allows a predetermined table (look-up-table (LUT)) 118, or more than one table, to be created and indexed by the MSB and/or LSB field and/or other fields (values) in the input sample 112.

The combiner logic 110 is adapted to produce sequences of enhanced pulses (e.g., a pulse stream) 114 based on the sequence of pulses from the pulse logic 106 and the edge placement data from the edge mover logic 108. For example, the combiner logic 110 is implemented as digital logic or other circuitry configured to adjust one or more edges (e.g., rising or falling edges) of the sequence of pulses based on the information contained in the edge adjustment data. The combiner may adjust a rising edge, a falling edge or both rising and falling edges of one or more pulses according to the edge adjustment data. The types of edges being adjusted can be set or programmable in response to a user input. Alternatively or additionally, the edge adjustment may be adapted on the fly based on the monitored signal characteristics or other feedback associated with the output and/or input signals.

In the example of FIG. 1, the device 100 also includes an analog reconstruction filter 120 following the combiner logic 110. The filter 120 converts the enhanced pulse stream (VSPWM) 114 into a corresponding analog signal. The reconstruction filter may be implemented as a low pass filter to remove noise (e.g., PWM noise) from the signal 114. Because of the resulting edge enhanced VSPWM 114 stream (provided by combiner logic 110), the resulting analog waveform may exhibit less noise, including less ripple at zero crossings. This enables simplied (e.g., and less costly) low pass filtering. The filter 120 may be separate (e.g., external) circuitry from the device 100 or be part of the device 100. In some examples, the filter 120 may be implemented by a load that is coupled to receive the output signal 114. The output analog signal may correspond to an analog waveform, such as a sine wave or another type of analog waveform. In some examples, the device 100 may be used in combination (either external to the device 100 or internal to the device 100) with high power switches, such as Gallium Nitride (GaN), Gallium Arsenide, Silicon Carbide or the like. The high power switches may form part of a high power stage (see, e.g., FIG. 10).

Figure 2:
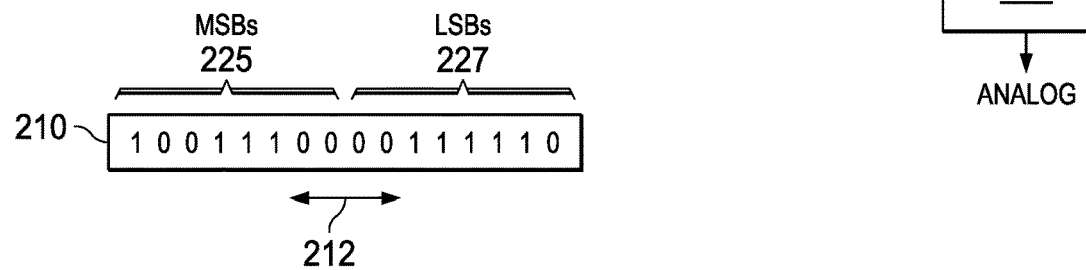
FIG. 2 illustrates an example of a multiple-bit value showing splitting value into an MSB portion and an LSB portion.

FIG. 2 illustrates one example of how to divide a 16-bit digital word into fields of MSBs and LSBs. The 16-bit value may represent a small frame, digital input data sequence, or another similar stream of values that is sampled from a digital input that is to be converted to enhanced digital data, such as disclosed herein. Once the 16-bit sample is received, it may be split into two (or more) fields that are stored. The 16 bit sample may be temporarily stored while it is being manipulated to generate the MSBs and LSBs having respective values representing pulse shape and at least one pulse edge location. Each value may be stored in a register, latches, a memory, or the like.

By way of example, FIG. 2 illustrates and example of a 16-bit value stored in a register with an upper MSB field 225 and a lower LSB field 227, both of 8-bits. These two fields 225, 227 are extracted from each data sample of the digital input. The upper MSB field 225 has a value that specifies the number and values of pulses to be created. For example, each bit of the field 225 correlates to a pulse having a prescribed width and an amplitude defined by the value of the bit. The lower LSB field 227 has an edge placement value that specifies which pulse edges to move and/or the amount each such edge is to be moved.

In the example of FIG. 2, each field 225, 227 has the same number of eight bits. In other examples, the fields 225 and 227 may be generated (e.g., by pulse splitter logic) to have different numbers of bits, and the input sample can be split into more than two (a pair of) fields. For instance, arrow 212 indicates that these two fields do not need to be split in the center (as in FIG. 7) but could be split into fields having more or less MSBs and LSBs. For example, the value may be split with an MSB field of 5-bits and an LSB field of 11-bits, with an MSB field of 10-bits and an LSB field of 6-bits, or other values.

As a further example, the MSB fields 225 are used for generation of the delta sigma (ΔΣ) sequence for a given frame. For each frame, the number of MSB bits determines the over sample rate (OSR) and the number of pulses per frame, such as according to equation 1:

$$\text{OSR}=\text{Pulses}_{frame}=2^m \ (m\text{:number of MSB bits: MSBs}). \tag{1}$$

As an example, each amplitude level represented by the MSBs may correspond to a respective sequence of pulses (a one-to-one correspondence). As another example, multiple amplitude levels may each correspond to the same pattern of pulses (a many-to-one correspondence) providing a lower resolution.

The LSBs are used to vary the pulse edges of the ΔΣ stream. For example, the number of bits determines how many high resolution steps are adjusted per frame. In some examples, one or both of the rising and falling edge locations are adjusted (e.g., by edge mover logic) to result in a pulse width variation from the original input sample. In other examples, pulse width may be maintained from the original input sample by adjusting both edges the same amount. The number of steps may be calculated, for example, according to equation 2:

$$\text{Steps}_{frame}=2^l-1 \ (l\text{:number of LSB bits:LSBs}). \tag{2}$$

Figure 3:
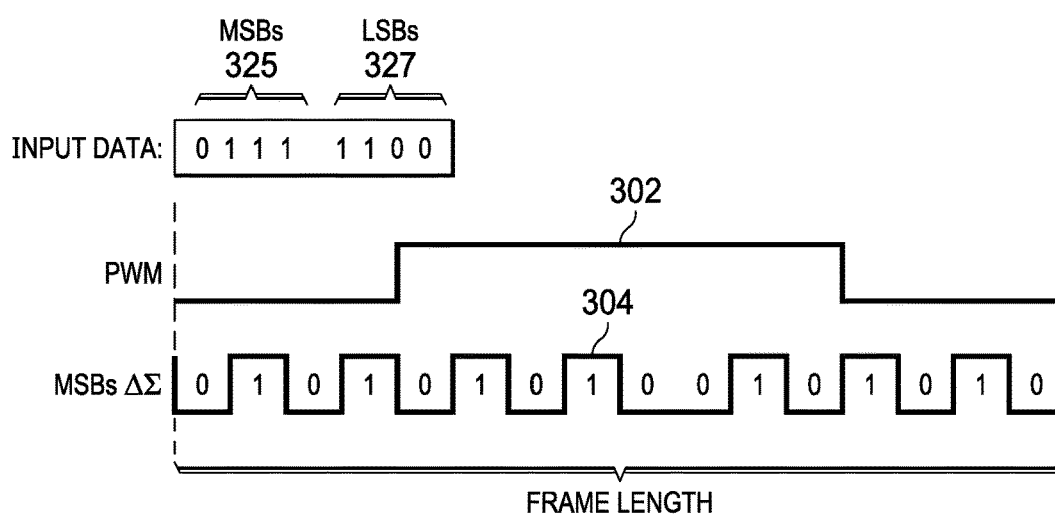
FIG. 3 illustrates an example waveform with pulses and the resulting $\Delta\Sigma$ sequence.

FIG. 3 illustrates an example PWM waveform 302 and the resulting sequence of ΔΣ data pulses 304 derived from an input sample. In this example, an input sample sequence of one byte has a value of [0111 1100] (124 dec). Splitting (e.g., by splitter logic 102) the byte into two equally sized fields yields an upper MSB field 325 of a 4-bit MSB [0111] (7 dec) and a lower LSB field 327 of a 4-bit LSB [1100] (12 dec).

Figure 4:
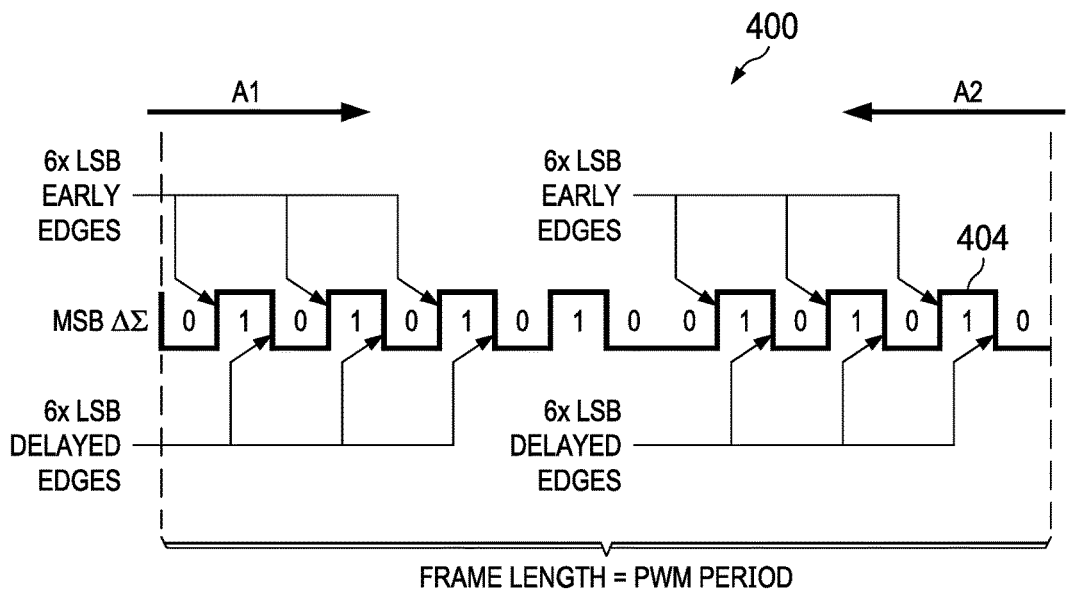
FIG. 4 illustrates an example of waveform pulses showing how edges of waveform pulses may be moved.

FIG. 4 illustrates an example of waveform pulses 404 showing how edges of those waveform pulses may be moved. FIG. 4 also illustrates an example of how the upper MSBs 425 are processed to determine pulse locations having edges that are selected for possible movement. FIG. 4 continues the example began with a reference to FIG. 3 that has an input sample byte [0111 1100] (124 dec) with 4-bit LSB [1100] (12 dec). Based on the LSBs extracted per input sample, the ΔΣ sequence 404 per frame is corrected by adjusting edges using LSB bits. In this example, applying Eq. 2, the lower LSB field 327 (FIG. 3) is processed such that the pulses of the ΔΣ sequence 404 will have a limit of 15 high resolution LSB steps per frame that are initially placed, if possible, near the outside pulse edges of the new enhanced pulse stream.

By way of example, the edge mover logic 110 may implement one or more edge adjustment strategies provided that edge placement rules are satisfied. For example, edge placement rules may enforce that a certain distribution of energy within an enhanced pulse sequence and/or maintain a minimum time interval between adjacent edge transitions. As an example, the minimum time interval between rising and falling edges may be set depending on switching speeds of circuitry used to generate pulses. By way of example, edge mover logic 110 can implement a strategy to start moving with a first outside edge or move edge by edge. As another example, if outside edges are not viable according to pulse placement rules, then pulse placement moves toward a center of the ΔΣ sequence of pulses 404, as illustrated, in the direction of arrows A1 and A2 in FIG. 4 until locating a pulse edge that is available for movement. Thus, various edge adjustment strategies may be implemented, such as disclosed herein.

As a further example, high power switching components have minimum ON and OFF times. Therefore, edge mover logic 110 may be configured to avoid too short of pulses. For example, if sample <FSC/2 (wherein FSC is the full scale of the register into which the input stream is sampled), the delta-sigma modulation contains more 0s than 1s. This implies that the LSBs should lengthen the pulses, not shorten them. Alternatively, if sample >FSC/2, the DS modulation contains more 1s than 0s. This implies the LSBs should shorten pulses. This detection and edge adjustment can be implemented by evaluating the values of the bits (e.g., by edge mover logic, such as programmed into the LUT) to modify the ΔΣ modulation accordingly. Knowing these results, a strategy of modifying edges can be implemented (e.g., by edge mover logic 110) based on a detected number of (or weight) of the number of 0s and 1s in first or second half of the ΔΣ sequence.

In some examples, it is desirable to avoid short pulses approaching positive or negative full scale. Accordingly, in some examples, the modulation may be set up with a rule so that no too short or too long pulse is created if the input sample is closer than 1 MSB of FSC. One solution may be saturating the sample before modulation so that the enhanced digital signal stays within at least one MSB of the rail so that a ΔΣ pulse can be computed. Whether or not the digital signal stays within the rails may impact the usable dynamic range, such as indicated by Equation 3 in the general form:

Dynamic Range=20*log($2^n$−($2*2^l$))

($n$:number of sample bits:MSBs+LSBs).

($l$:number of LSB bits:LSBs). (3)

In a first example, an input sample of 8-bits/1-byte is split (by splitter logic) into two fields, with one field of 4-bit MSBs and a second field with 4-bit LSBs, such as for use in creating enhanced digital data before conversion into an analog waveform, (e.g., by a DAC) as discussed above. For these values:

Dynamic Range=20*log($2^8$−($2*2^4$))=20*log(256−32)
=47 dB, instead of 48.16 dB, which is a theoretically expected value.

In a second example, the Input sample is increased to a 16-bit word that is split into fields with a 6-bit MSB and a 10-bit LSB, which yields:

Dynamic Range=20*log($2^{16}$−($2*2^{10}$))=20*log
(65536−2048)=96.05 dB, instead of 96.33 dB.

Figure 5:
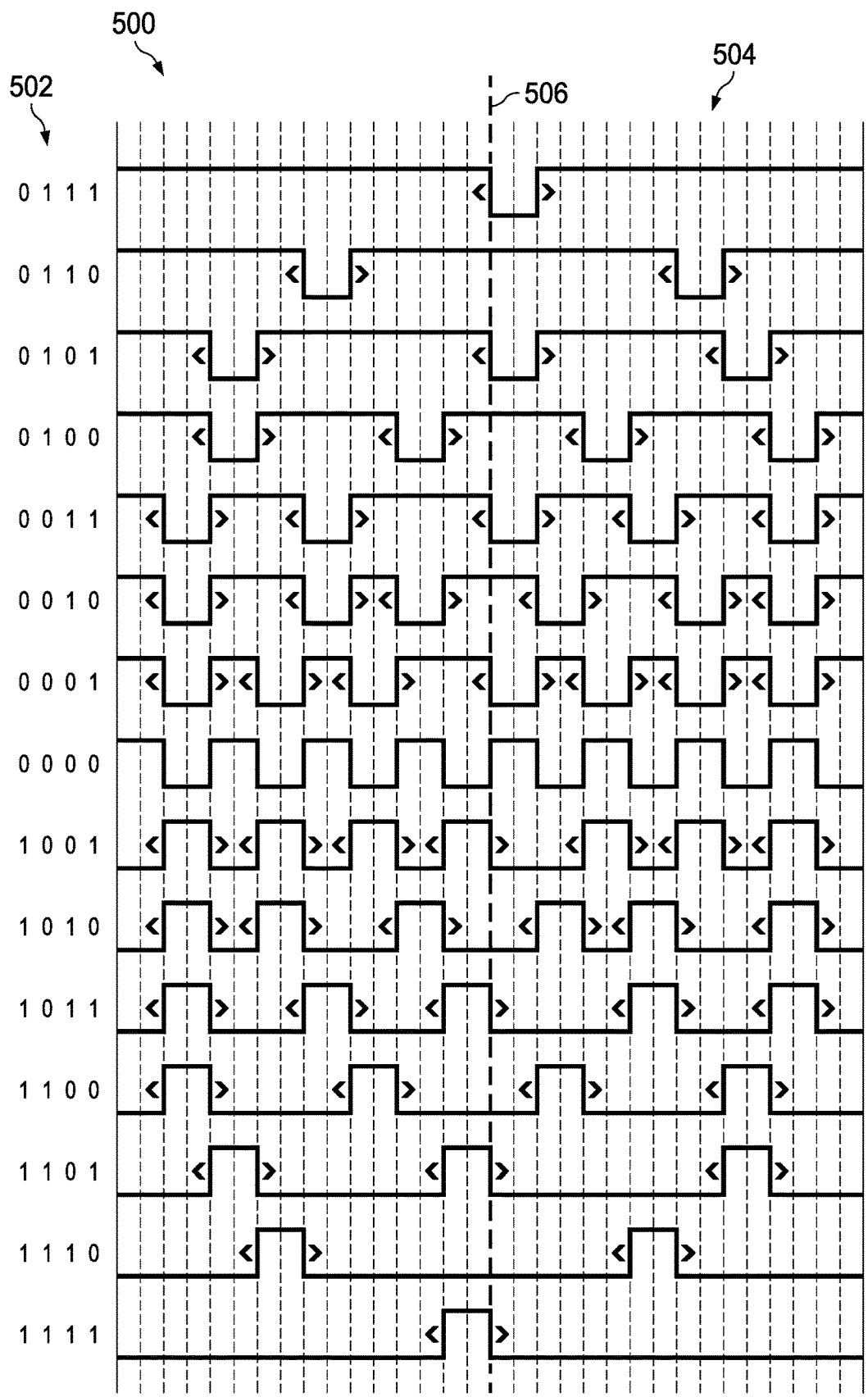
FIG. 5 illustrates an example of waveform pulses showing how both rising and falling edges of a waveform pulse may be moved.

FIG. 5 illustrates a chart 500 demonstrating examples of ΔΣ sequences patterns generated based on MSBs and how edges may be moved based on LSB, such as when having the freedom to move one or both edges of any rising or falling edge of a pulse. In the example of FIG. 5, the chart 500 includes different values of MSBs in a left-side column 502 that correspond to the MSBs extracted from the input sample data. Thus, in this example, each possible value of the four bit MSBs maps directly to a corresponding amplitude dependent ΔΣ pattern of pulses 504. Each ΔΣ pattern 504 has an energy that is approximately equally distributed for the frame relative to a centerline 506. In examples disclosed herein, the width of one or more pulses in a given pattern is varied to achieve energy granularity for LSB resolution. The variation in pulse width based on the LSB value may be implemented, for example, by moving one or more pulse edges in either direction with respect to time, forward or backward, such as in a direction indicated by ">" and "<" (arrow symbols) respectively, according to the value of LSBs. As an example, for values greater than FSC/2, gaps are widened by moving edges of a given pulse in opposite directions. For values less than FSC/2, adjacent edges of a given pulse can be moved in opposite directions to widen such pulse. The particular edge (or edges) and direction that each edge is moved per frame may be predetermined, calculated to provide a statistical or equal distribution per frame or otherwise determined from the LSBs.

Figure 6:
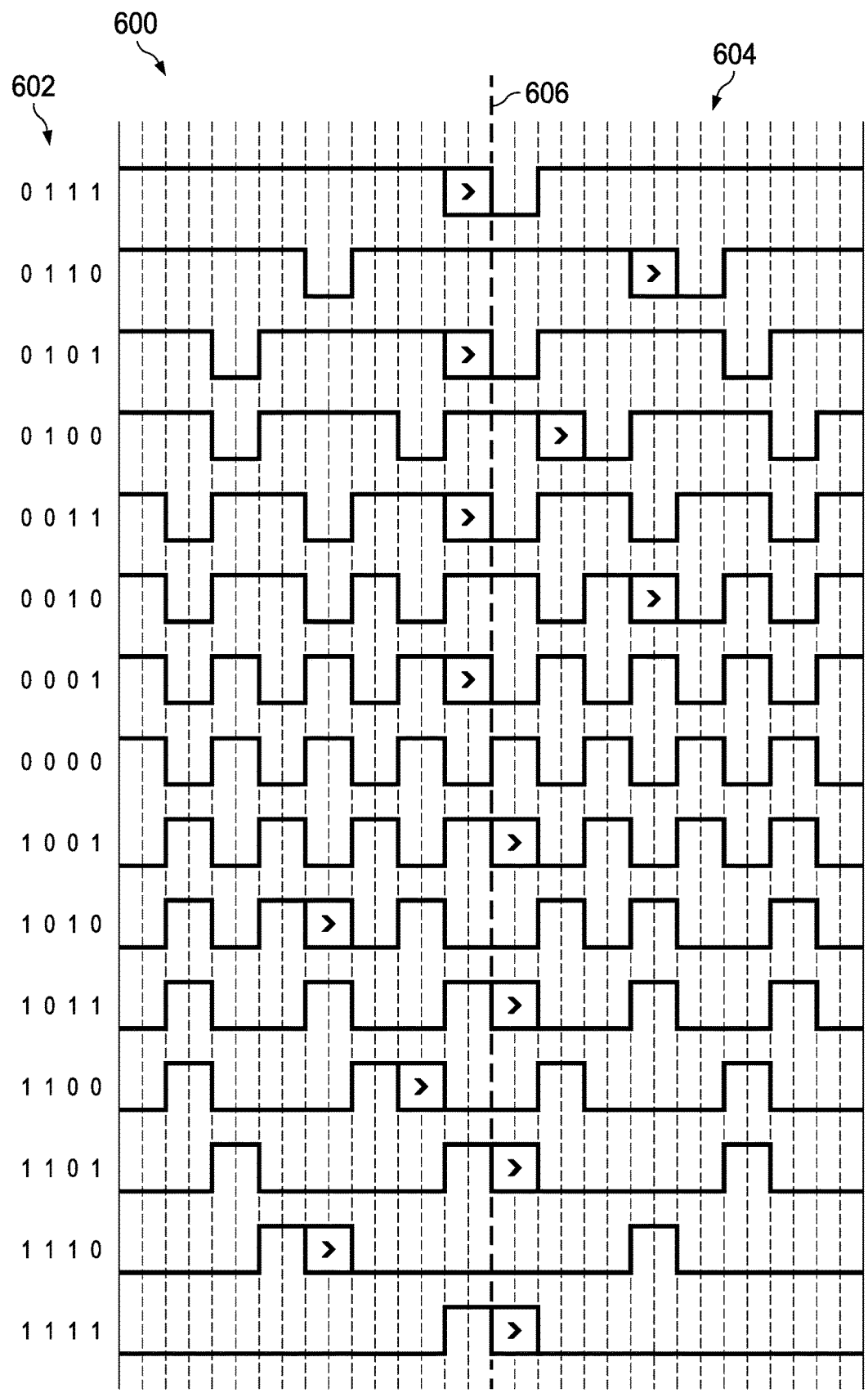
FIG. 6 illustrates an example of waveform pulses showing how an edge of a waveform pulse may be moved forward.

The listing of ΔΣ where a single edge is moved for each item in the chart 600 of FIG. 6. FIG. 6 illustrates another example chart 600 based on the same input sample data as FIG. 5 but demonstrating a different edge adjustment strategy. In the example of FIG. 6, a similar left-side column 602 that corresponds to the MSBs of the input data and the same initial listing of strings of pulses of the ΔΣ sequences 604. The listing of delta-sigma waveforms (e.g., ΔΣ sequences 604) for each of the MSBs with the predefined corresponding ΔΣ stream of pulses 604 is located adjacent its MSBs value. FIG. 6 illustrates one example of MSBs bit values assigned to ΔΣ sequences 604. The ΔΣ sequences 604 of pulses are distributed for a frame length with respect to a centerline 606.

In the example of FIG. 6, the rule of moving pulse edges (e.g., utilized by edge mover logic) specifies that only one edge of a single pulse of each of the ΔΣ sequences 604 may be moved forward, but not in reverse. Thus, with the opportunity of moving a single pulse edge forward, in one example, it is desirable to pick a pulse edge having the greatest effect on spreading the energy of its pulse string that results in reducing an amount of low frequency amplitudes and minimum switching times are not violated. Because only one edge may be moved forward, in some examples, a pulse near the centerline 606 may be selected for edge adjustment. Other edge adjustment strategies may be utilized in other examples provided that edge adjustment rules (e.g., distribution of energy and on/off switching time restrictions) remain enforced. The edge selection rules may select the pulse edge having a greatest effect (relative to other pulses in the current frame) on spreading signal energy, reducing noise, reducing zero crossing, and the like.

In FIG. 6, the waveforms are shown before and after one or more of their edges may have been moved as well as after a single edge of each of the string of pulses (ΔΣ sequences 604) have been moved. Of course, this is one example of how edge of a single pulse may be moved forward based on a value of the LSBs corresponding to that input data as well as in combination with the one or more general rules discussed above. As mentioned (see, e.g., Eq. 2), the LSBs may specify a number of high-resolution steps that may be adjusted per frame. FIG. 6 also illustrates how moving a pulse nearest to the centerline 606 may help in efficiently spreading energy, reducing ripple amplitudes around the zero crossing of a periodic waveform to reduce overall noise of the enhanced ΔΣ sequence before the ΔΣ sequence 604 is converted into an analog signal exhibiting such characteristics.

Figure 7:
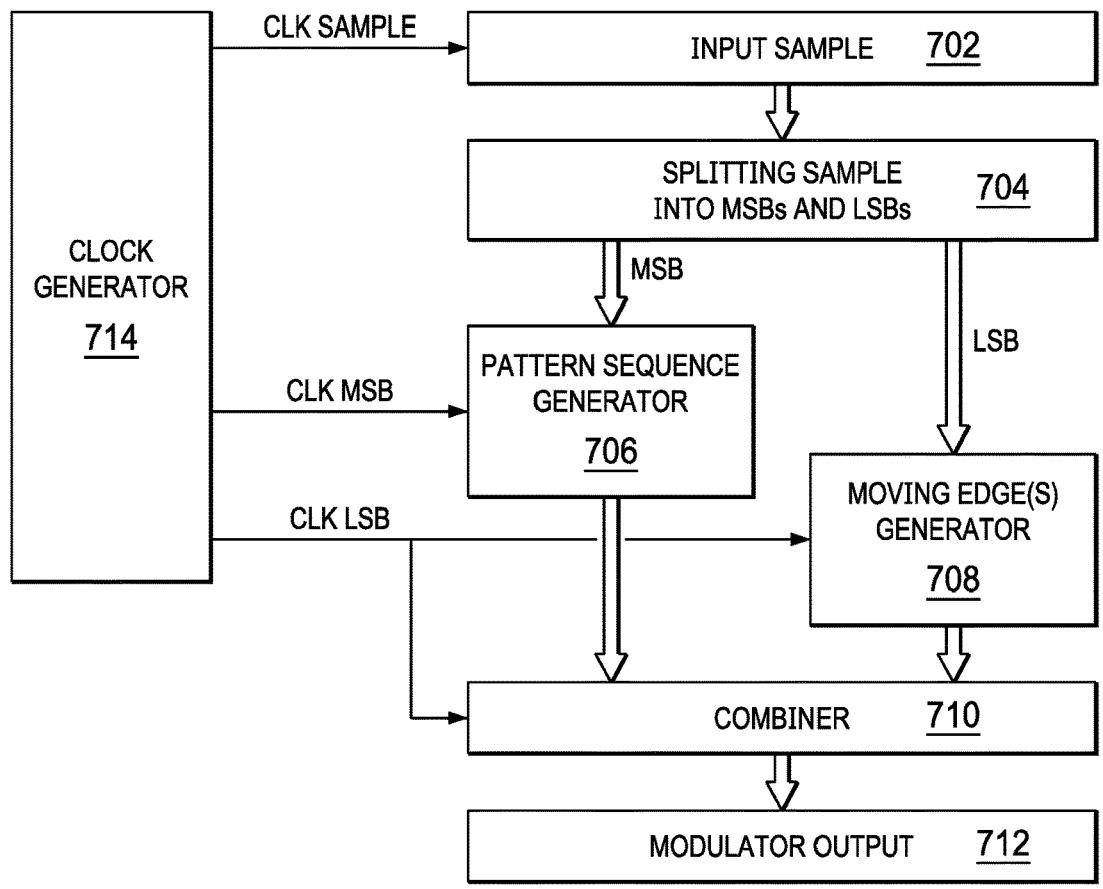
FIG. 7 illustrates a block diagram of another example device to implement variable stream pulse width modulation.

FIG. 7 illustrates another example architecture of a device 700 corresponding data flow to enhance digital signals. The signals may be periodic as well as sinusoidal signals for later conversion to an analog signal. This example device 700 includes input buffers 702 to buffer samples streams of input data represented as digital inputs pulses in preparation for processing the streams of input data. This device 700 further includes a splitter 704 that can split input data into two or more fields as discussed above.

In some examples, the modulator device 700 can include a code rectification and limiter function that processes each input sample. For example, the code rectification converts a multi-bit input sample into rectified bit segments of MSBs and LSBs. As an example, code rectification can convert an input sample to a format having a sign bit and a representation of the amplitude. Such rectification can facilitate implementing additional logic functions. A limiting function can further process as inputs, the rectified MSBs and LSBs (from code rectification logic) to output limited MSB segments and LSB segments. For example, the limiting function can compress each of the values in the respective segments to a desired dynamic range. Such limiting function can be applied to input samples before or after rectification.

A pattern/sequence generator 706 and a moving edge generator 708 are configured to operate on MSB and LSB fields similar to the device 100 of FIG. 1, as discussed above. In examples when rectification and limiting functions are utilized, generators 706 and 708 operate on the rectified and limited MSBs and LSBs, respectively. The pattern/sequence generator 706 outputs a pattern of pulses based on values of the MSBs. The moving edge generator 708 determines edge adjustment data based on the values of the LSBs.

A combiner 710 combines outputs from the pattern/sequence generator 706 and the moving edge generator 708 together to build an enhanced digital signal 712 representative of the original input data from which the enhanced digital signal 712 originated. However, the enhanced digital signal 712 has characteristics so that when the enhanced digital signal 712 is converted into an analog signal (e.g., by a reconstruction filter), it contains enhanced noise reduction features as compared to the original stream of input data.

As illustrated, the data-path on the right side of FIG. 7 operates on the input data as such data travels on a MSBs bus and an LSBs bus both sized (e.g., as data registers or buffers) in accordance of the number of bits represented by the input data sample that is extracted from the digital input stream. For example the buses may be a byte wide bus, 32-bit wide word bus, or another size of bus so the similar bits are operated on the same time as groups of similar bits. The device 700 further includes a clock generator logic 714 to generate a CLK_sample for sampling and/or clocking the input data. The clock generator logic 714 also generates a CLK_MSB and a CLK_LSB to clock data-paths, respectively, of the MSB fields and the LSB fields until these data-paths merge upon exiting the combiner 710.

Figure 8:
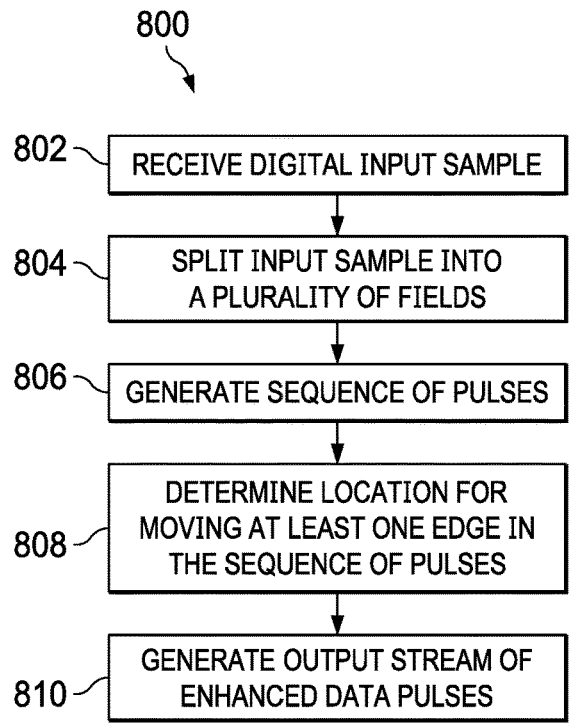
FIG. 8 is a flow diagram illustrating an example method for creating enhanced digital data resulting in a better digital-to-analog conversion of that digital data.

In view of the foregoing structural and functional features described above, a method in accordance with various aspects of the present disclosure will be better appreciated with reference to the figures. FIG. 8 illustrates and describes some actions of a method 800 of generating enhanced (e.g., less noisy) digital data to facilitate conversion to analog data, such as with a filter or other suitable device. While, for purposes of simplicity of explanation, the method 800 of FIG. 8 is shown and described as executing serially, the present disclosure is not limited by the illustrated order. Some aspects of the method 800 could occur, in accordance with this disclosure, in different orders and/or concurrently with other aspects from that shown and described herein. Moreover, not all illustrated features may be required to implement a method. For simplicity of explanation, the methods of FIG. 8 can include additional functional features not discussed, with FIG. 8 being described with reference to the examples illustrated herein. The method may be implemented by hardware logic (e.g., implemented in an FPGA or by discrete components) or executing instructions (e.g., by an ALU—stand alone or within a processor).

FIG. 8 illustrates an example method 800 of generating enhanced digital data, such as variable-stream PWM data, which may be converted to analog data, such as the devices of FIGS. 1 and 7 illustrate. At 802, a digital input sample is received. For instance, a stream of input digital data is sampled to provide the input sample (e.g., a multi-bit data frame), which can be received at an input of a device (e.g., 100, 700). Each of a plurality of continuous samples may be consecutively processed according to the method to provide a corresponding output stream. At 804, the method includes splitting (e.g., by splitter logic 102, splitter 704) the input sample into a plurality of fields, such as including a segment of most significant bits and a segment of least significant bits. At 806, a sequence of pulses is generated (e.g., by pulse logic 106, generator 706) based on the segment of most significant bits. At 808, a location for moving at least one edge in the sequence of pulses is determined based on the segment of least significant bits.

In some examples one or both generating (at 806) the sequence of pulses or determining (at 808) of edge adjustments may be implemented by one or more LUTs (e.g., LUT 118). For example, the sequence of pulses may be generated by looking up, in memory, data specifying the sequence of pulses that is indexed based on the segment of most significant bits. Additionally or alternatively, the edge adjustment data may be determined by looking up in memory, as indexed by the segment of least significant bits, edge adjustment data that specifies the location for moving the at least one edge in the sequence of pulses.

At 810, an output stream of enhanced data pulses is generated by adjusting the at least one edge of the sequence of data pulses based on the determined location (at 808). In some examples, the method 800 may further include generating a stream of analog output signals from the stream of enhanced data. That is, the method may also include converting (e.g., by filter 120) the stream of enhanced data pulses into a corresponding analog output signal.

Figure 9A:
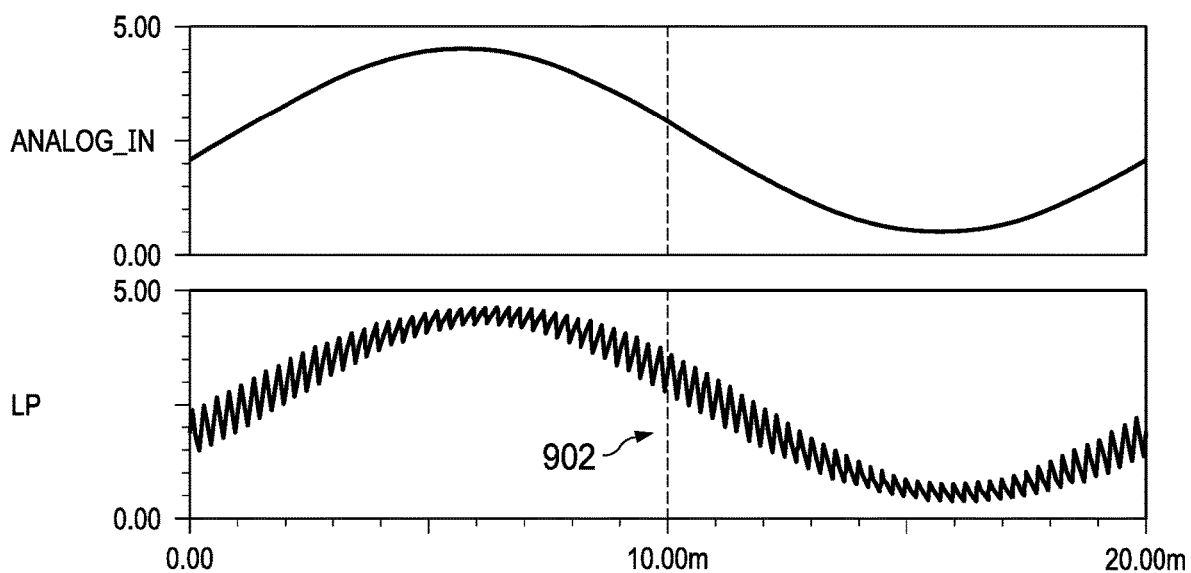
FIG. 9A is a graph of waveforms showing significant ripple on a PWM sinewave near the zero crossing.
Figure 9B:
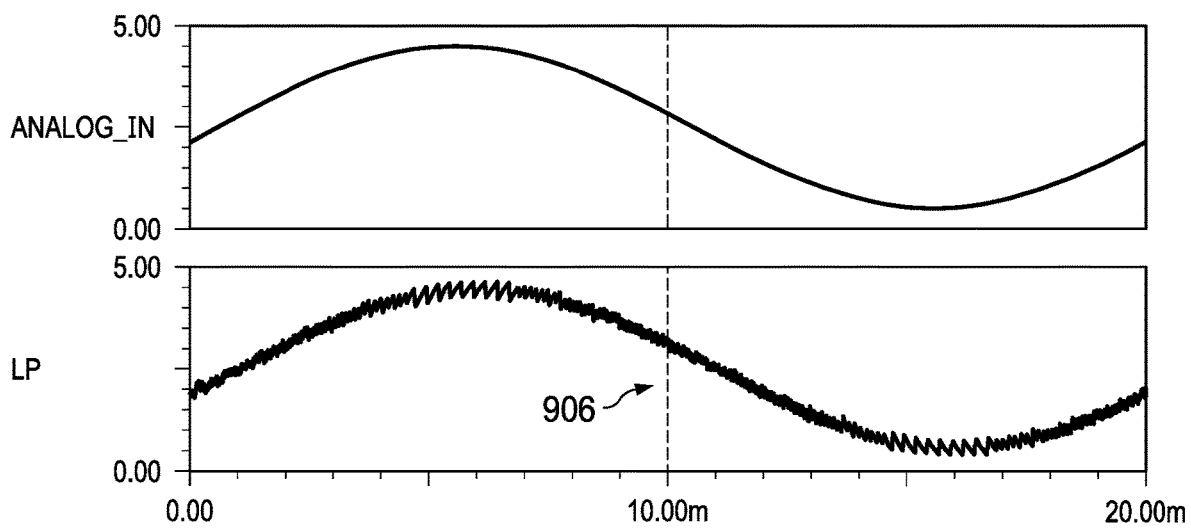
FIG. 9B is a graph of waveforms showing ripple reduction on a VSPWM sinewave near the zero crossing.

FIGS. 9A and 9B illustrate example of waveform plots showing input analog signals and output PWM signals. In the example of FIG. 9A, the input waveform 900 is an analog signal and the corresponding output waveform 902 generated by PWM and low pass filtered. In FIG. 9B, the same analog waveform 904 is shown with a variable stream PWM output waveform 906 that has been filtered (by low pass filter). A comparison of the PWM output waveforms 902 and 906 demonstrates improved ripple over the input waveform, including near the zero crossing. The reduced ripple is due to the VSPWM signal that results from edge adjustment of the respective pulses, as disclosed herein.

Figure 10:
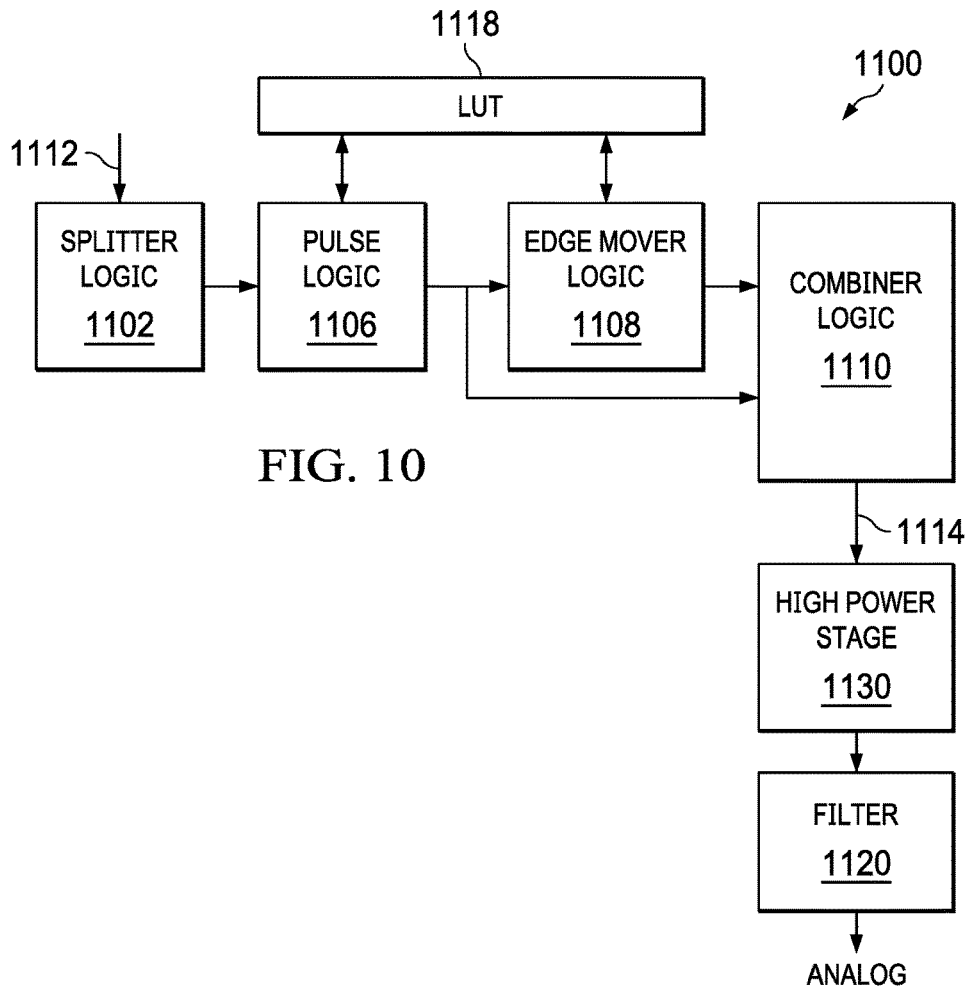
FIG. 10 is a block diagram illustrating another example device to implement variable stream pulse width modulation in conjunction with a high power stage.

FIG. 10 illustrates is a block diagram illustrating another example device 1100 to implement variable stream pulse width modulation in conjunction with a high power stage. The device 1100 is similar to the device 100 of FIG. 1 and features previously introduced and described with respect to FIG. 1 are shown in FIG. 10 by using the same reference numbers increased by adding 1000. Additional information about such elements may be obtained by reference back to FIG. 1. Briefly stated, the device includes splitter logic to receive and to split an input sample data 1112 into at least first and second fields (e.g., an MSB field and an LSB field). Pulse logic 1106 is configured to determine a sequence of one or more pulses based on a pulse structure value of one of the fields (e.g., the MSB field). Edge mover logic 1108 is configured to determine edge adjustment data based on a pulse placement value of another data field (e.g., the LSB field). The edge adjustment data specifies where one or more edges of the sequence of one or more pulses (e.g., a ΔΣ sequence of pulses) is to be moved. In some examples, the device 1100 includes a LUT 1118 that is preprogrammed with edge adjustment values indexed by the pulse placement value to provide the edge adjustment data. Additionally or alternatively, the LUT 1118 can be programmed to provide a ΔΣ sequence of pulses based on the MSBs. Combiner logic 1110 is configured to combine the sequence of the one or more pulses (determined by pulse logic 1106) and the edge adjustment data (determined by edge mover logic 1108) to provide an enhanced output pulse stream (e.g., a VSPWM output). As another example, in place of storing precomputed values in an LUT, the LUT may be omitted and the pulse sequence and/or the edge adjustments may be computed (e.g., by an ALU) in real time, base on MSBs, LSBs or both constituting the input sample.

In the example of FIG. 10, the device 1100 includes a high-power stage coupled at the output of combiner logic 1110. For example, the high-power stage 1130 is configured to amplify the VSPWM output stream and provide an amplified version thereof. The amplified VSPWM signal may be provided to a filter, such as a low pass filter to convert the amplified signal to a corresponding analog signal. As an example, the high power stage 1130 includes an arrangement of high power switches (e.g., metal oxide semiconductor field effect transistor (MOSFET) devices) that are configured as a switching converter (e.g., a half-bridge or H-bridge). For example, the switches can be implemented as high frequency, high power switches, such as Gallium Nitride or Silicon Carbide or Gallium Arsenide to name a few. The high power stage thus provides the amplified VSPWM signal to the filter 1120 to convert the signal to a corresponding analog signal. As mentioned, the filter 1120 can be standalone filter (e.g., a low pass filter) or be implemented by a load to where the amplified signal is provided. That is, the load itself can be adapted to implement a corresponding filter function.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims. As used herein, the term "includes" means includes but not limited to, the term "including" means including but not limited to what is listed. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit device comprising:
    splitter logic configured to:
        receive a data frame; and
        provide a first subset of the data frame and a second subset of the data frame;
    pulse logic coupled to the splitter logic and configured to:
        receive the first subset of the data frame; and
        provide a first sequence of pulses having respective widths determined by the first subset of the data frame;
    edge mover logic coupled to the splitter logic and configured to:
        receive the second subset of the data frame; and
        provide edge adjustment data for the first sequence of pulses based on the second subset of the data frame; and
    combiner logic coupled to the pulse logic and the edge mover logic and configured to:
        receive the first sequence of pulses and the edge adjustment data; and
        provide a second sequence of pulses by adjusting the first sequence of pulses according to the edge adjustment data.

2. The circuit device of claim 1 further comprising an amplifier stage coupled to the combiner logic and configured to amplify the second sequence of pulses.

3. The circuit device of claim 2 further comprising a filter coupled to the amplifier stage and configured to provide an analog signal in response to the amplified second sequence of pulses.

4. The circuit device of claim 3, wherein the filter includes a low-pass filter stage.

5. The circuit device of claim 1, wherein the first subset of the data frame includes most significant bits of the data frame and the second subset of the data frame includes least significant bits of the data frame.

6. The circuit device of claim 1 further comprising a look-up table coupled to the pulse logic and the edge mover logic, wherein:
    the pulse logic is configured to provide the first sequence of pulses based on the look-up table; and
    the edge mover logic is configured to provide the edge adjustment data based on the look-up table.

7. The circuit device of claim 1, wherein the pulse logic is configured to provide the first sequence of pulses having a number of pulses determined by the first subset of the data frame.

8. The circuit device of claim 1, wherein the pulse logic is configured to provide the first sequence of pulses as a delta sigma sequence that is based on the first subset of the data frame.

9. A method comprising:
    receiving a data frame;
    dividing the data frame into a first portion and a second portion;
    determining a first sequence of pulses based on the first portion of the data frame, wherein pulse widths of the first sequence of pulses are based on the first portion of the data frame;
    determining an edge adjustment for the first sequence of pulses based on the second portion of the data frame; and
    applying the edge adjustment to the first sequence of pulses to produce a second sequence of pulses.

10. The method of claim 9, wherein a number of pulses in the first sequence of pulses is based on the first portion of the data frame.

11. The method of claim 9 further comprising amplifying the second sequence of pulses.

12. The method of claim 9 further comprising applying a filter to the second sequence of pulses to produce an analog signal.

13. The method of claim 12, wherein the filter includes a low-pass filter.

14. The method of claim 9, wherein the first sequence of pulses represents most significant bits of the data frame and the second sequence of pulses represents least significant bits of the data frame.

15. A device comprising:
pulse logic configured to provide a first sequence of pulses in response to a first subset of a data frame;
edge mover logic configured to provide edge adjustment data for the first sequence of pulses in response to a second subset of the data frame;
combiner logic coupled to the pulse logic and the edge mover logic and configured to provide a second sequence of pulses by adjusting the first sequence of pulses according to the edge adjustment data;
an amplifier stage coupled to the combiner logic and configured to amplify the second sequence of pulses; and
a filter stage coupled to the amplifier stage and configured to produce a filtered output signal in response to the second sequence of pulses.

16. The device of claim 15, wherein pulse widths of the first sequence of pulses are based on the first subset of the data frame.

17. The device of claim 16, wherein a number of pulses in the first sequence of pulses is based on the first subset of the data frame.

18. The device of claim 15, wherein the filter stage includes a low-pass filter stage.

19. The device of claim 15, wherein the first subset of the data frame includes most significant bits of the data frame and the second subset of the data frame includes least significant bits of the data frame.

20. The device of claim 15 further comprising a look-up table coupled to the pulse logic and the edge mover logic, wherein:
the pulse logic is configured to provide the first sequence of pulses based on the look-up table; and
the edge mover logic is configured to provide the edge adjustment data based on the look-up table.

* * * * *